United States Patent
Takahashi

(10) Patent No.: US 10,573,371 B2
(45) Date of Patent: *Feb. 25, 2020

(54) SYSTEMS AND METHODS FOR CONTROLLING DATA STROBE SIGNALS DURING READ OPERATIONS

(71) Applicant: Micron Technology, Inc., Boise, ID (US)

(72) Inventor: Tsugio Takahashi, Sagamihara (JP)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 16/543,168

(22) Filed: Aug. 16, 2019

(65) Prior Publication Data

US 2020/0027495 A1 Jan. 23, 2020

Related U.S. Application Data

(63) Continuation of application No. 16/042,924, filed on Jul. 23, 2018, now Pat. No. 10,431,293.

(51) Int. Cl.
*G11C 11/4076* (2006.01)
*G11C 11/4096* (2006.01)
*G11C 11/408* (2006.01)

(52) U.S. Cl.
CPC ...... *G11C 11/4076* (2013.01); *G11C 11/4087* (2013.01); *G11C 11/4096* (2013.01)

(58) Field of Classification Search
CPC ............ G11C 11/4076; G11C 11/4087; G11C 11/4096
USPC .......................................................... 365/193
See application file for complete search history.

(56) References Cited

U.S. PATENT DOCUMENTS

| | | | |
|---|---|---|---|
| 8,565,032 B2* | 10/2013 | Abe | G11C 7/22 365/193 |
| 8,675,425 B2* | 3/2014 | Schuetz | G06F 13/1689 365/191 |
| 8,929,162 B1* | 1/2015 | Fender | G11C 7/1051 365/193 |
| 9,037,774 B2 | 5/2015 | Solomon et al. | |
| 9,568,542 B2* | 2/2017 | Lin | G01R 31/2834 |
| 9,892,772 B2* | 2/2018 | Song | G11C 7/22 |
| 2001/0014053 A1 | 8/2001 | Li | |
| 2005/0012533 A1 | 1/2005 | Aoyama et al. | |
| 2008/0094918 A1 | 4/2008 | Fujizoe | |

(Continued)

OTHER PUBLICATIONS

PCT International Search Report & Written Opinion for PCT Application No. PCT/ US2019/027680 dated Aug. 2, 2019; 11 Pages.

*Primary Examiner* — Fernando Hidalgo
(74) *Attorney, Agent, or Firm* — Fletcher Yoder, P.C.

(57) ABSTRACT

An apparatus may include a first data strobe (DQS) output buffer (OB), a second DQS OB and control logic. The first data strobe (DQS) output buffer (OB) and the second DQS OB are each coupled to a DQS terminal. The first DQS OB and the second DQS OB are configured to provide a DQS signal to the DQS terminal responsive to a read clock signal. The control logic is configured to receive the read clock signal to control the first DQS OB and the second DQS OB. The apparatus is configured to selectively prevent the control logic from receiving the read clock signal while the DQS signal is being provided to the DQS terminal.

21 Claims, 7 Drawing Sheets

(56) References Cited

U.S. PATENT DOCUMENTS

2009/0244994 A1 10/2009 Kim et al.
2017/0270995 A1* 9/2017 Maryan ................ G11C 7/1087

* cited by examiner

SYSTEMS AND METHODS FOR CONTROLLING DATA STROBE SIGNALS DURING READ OPERATIONS

CROSS-REFERENCE TO RELATED APPLICATION

Under 35 U.S.C. § 120, this application is a continuation of U.S. patent application Ser. No. 16/042,924 filed on Jul. 23, 2018, which is incorporated by reference herein in its entirety for all purposes.

BACKGROUND

The present disclosure relates generally to memory devices and, more particularly, to synchronous memory devices and techniques for controlling data strobe signals during read operations.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Generally, a computing system may include an electronic device that, in operation, communicates information via electrical signals. For example, a computing system may include a processor communicatively coupled to a memory device, such as a dynamic random-access memory (DRAM). In this manner, the processor may communicate with the memory device, to retrieve executable instructions, retrieve data to be processed by the processor, and/or store data output from the processor, using command and/or address signals (CA signals), for instance. These CA signals may be supplied to a common bonding pad, a pin, an external terminal, or the like.

In synchronous memory devices, such as synchronous DRAM (SDRAM), CA signals are provided to the memory device, synchronously, with an external clock signal that may be provided by a processor. Various internal clock signals are generated within the memory device from the external clock signal and are used to synchronize command and data signals to ensure proper operation of the memory device. That is, various internal clock signals are generated and used within the memory device to complete various operations within the memory device, such as read commands and write commands, based on various CA signals. For read commands, some internal circuits and internal clock signals may not be needed in certain modes of operation. For instance, internal data strobe signals that may otherwise be generated and utilized, may not always be needed during all modes of operation. In these instances, power consumption may be unnecessarily increased if the internal clock signals are generated but unused. Embodiments of the present disclosure may be directed to techniques for controlling data strobe signals during read operations, to reduce power consumption during certain modes of operation.

BRIEF DESCRIPTION OF THE DRAWINGS

Various aspects of this disclosure may better be understood upon reading the following detailed description and upon reference to the drawings in which.

DETAILED DESCRIPTION

Figure 1:
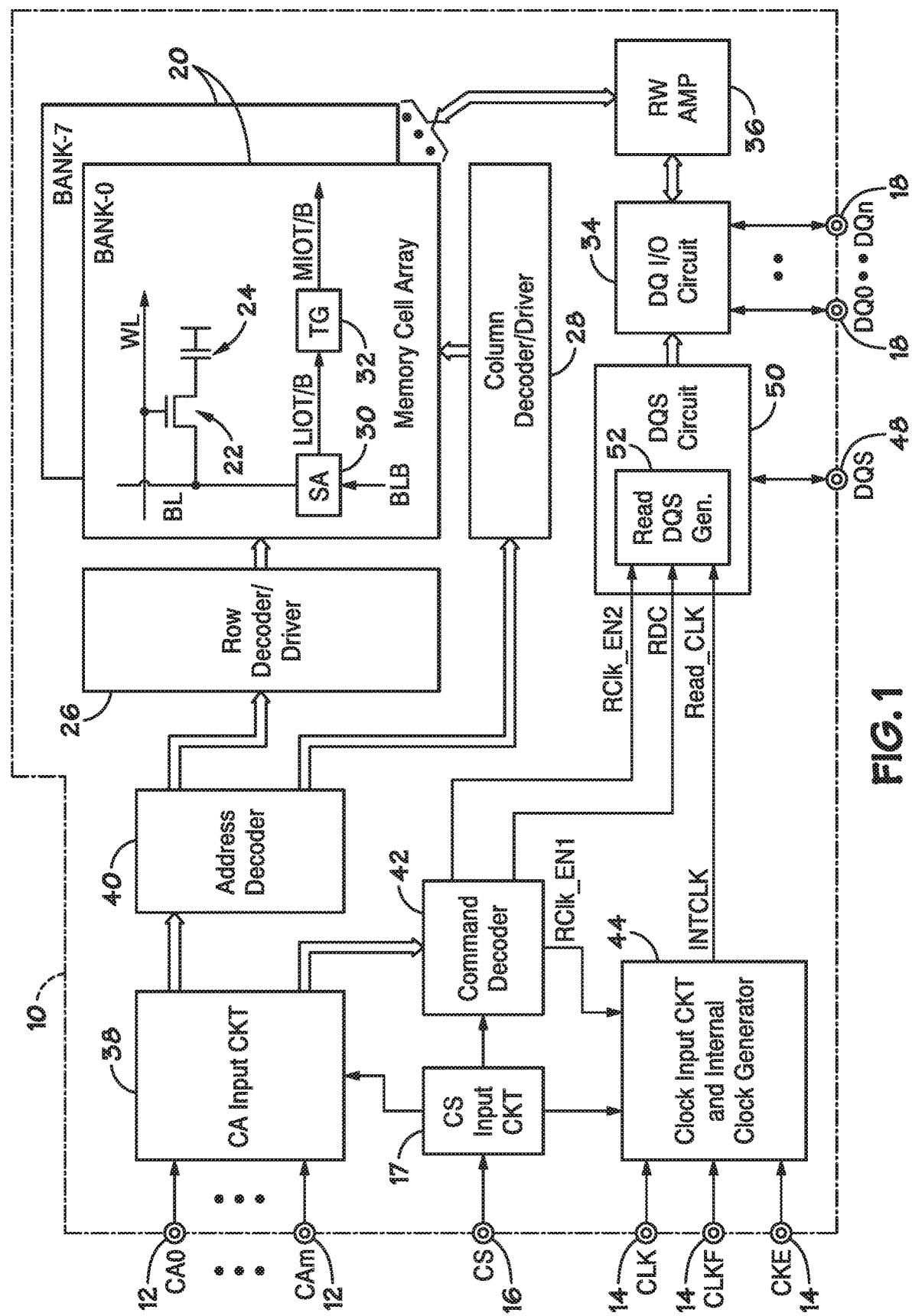
FIG. 1 is a block diagram of a memory device, in accordance with an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions are made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

Generally, a computing system may include electronic devices that, in operation, communicate information via electrical signals. For example, electronic devices in a computing system may include a processor communicatively coupled to memory. In this manner, the processor may communicate with memory to retrieve executable instructions, retrieve data to be processed by the processor, and/or store data output from the processor via issuing command and/or address (CA) signals to the memory. The CA signals facilitate access operations with respect to memory cell arrays included in the memory. For purposes of this disclosure, the CA signals should be understood to mean command signal(s), address signal(s), or both, command and address signal(s).

Random access memory (RAM) devices, such as the ones that may be employed in electronic devices to provide data processing and/or storage, may provide direct availability to addressable data stored in memory circuitry of the device, in response to the CA signals. Certain RAM devices, such as synchronous dynamic RAM (SDRAM) devices may, for example, have multiple memory banks having many addressable memory elements in each memory bank. A strobe-based data bus may be used, in combination with certain strobe signals, to provide read and write access to the addressable memory elements. The data strobe signals (e.g., DQS) may include a programmable pre-amble portion, a data read out period, and a post-amble portion. The programmable pre-amble portion may provide for a programmable timing window for the receiving device to enable data capture circuitry while a known/valid level is present on the strobe signal, thus avoiding false triggers of the data capture circuitry. Following the programmable pre-amble portion and during the data read out period, the DQS will toggle along with a clock signal through high and low transitions to transfer data. Time following the last transition is then known as the post-amble portion. As described further below, as used herein, the "data read out period" refers to the amount of time (i.e., number of clock cycles) it takes to transfer (i.e., read) the data associated with a single read operation or command (RD), and will be dependent on a number of factors such as memory type and burst length (BL).

For read operations, the DQS signals may be synchronous with internal clock signals (e.g., Read_CLK), generated from the external clock signal(s) (e.g., CLK and/or CLKF). As appreciated, each read command (RD) includes a particular burst length (BL) that allows for a certain number of bits to be read in response to each read command (RD). For instance, if the burst length (BL) is equal to 16, 16-bits of data will be read out consecutively, responsive to a single read command. For double data rate (DDR) SDRAM devices, 16-bits will be read out in 8 clock cycles (8-tCK). Based on the timing of successive read commands, the memory device may operate in either a "single read" (or "non-burst read") mode or a "consecutive burst read" (or "burst read") mode. If successive read commands are received at a time interval greater than the time it takes to capture the data equivalent to one BL (i.e., the data read out period), the read command will be a "non-burst read operation." Conversely, if successive read commands are received as consecutive read commands at a time interval less than or equal to the time it takes to capture the data equivalent to one BL (i.e., the data read out period), the read command will be a "burst read operation." For instance, for a DDR SDRAM device with a BL equal to 16, if successive read commands are received at a time interval of more than 8-tCK, the second command will be considered to be a non-burst read operation. If successive read commands are received at a time interval of less than or equal to 8-tCK, the second command will be considered a burst read operation.

In general, a Read DQS Generator may be provided within a DQS Circuit of the memory device. The Read DQS Generator includes Control Logic configured to provide control signals to drivers to drive the output of the DQS pin or terminal, responsive to the internal Read_CLK signal. However, depending on the timing of successive read commands (i.e., whether the read operations are burst or non-burst operations), certain internal clock signal states and the circuits that generate those signals, may be unnecessary. As provided herein, the Read DQS Generator may include a gate circuit that is configured to switchably provide the internal Read_CLK signal to the Control Logic such that the drivers configured to drive the DQS terminal are disabled during burst read modes of operation. As described further below, by disabling portions of the Read DQS Generator during burst read operations, unnecessary toggling and signal generation may be avoided and thus, power savings may be advantageously realized in the memory device.

Turning now to the figures, FIG. 1 is a simplified block diagram illustrating certain features of a memory device 10 included in an apparatus, electronic device, or semiconductor device, for instance. In some embodiments, the memory device 10 may be disposed in (physically integrated into or connected to) a host device (not illustrated) or otherwise coupled to a host device. The host device may include any one of a desktop computer, a laptop computer, a pager, a cellular phone, a personal organizer, a portable audio player, a control circuit, a camera, and the like. The host device may also be a network node, such as a router, a server, and/or a client (e.g., one of the previously-described types of computers). Alternatively, the host device may be another type of electronic device, such as a copier, a scanner, a printer, a game console, a television, a set-top video distribution or recording system, a cable box, a personal digital media player, a factory automation system, an automotive computer system, or a medical device, for instance. It is noted that the terms used to describe these various examples of systems, like many of the other terms used herein, may share some referents and, as such, should not be construed narrowly in virtue of the other items listed.

The host device may, thus, be a processor-based device, which may include a processor, such as a microprocessor, that controls the processing of system functions and requests in the host device and of the memory device 10. Further, any host processor may comprise a plurality of processors that share system control. The host processor may be coupled directly or indirectly to additional system elements of the host device, such that the host processor controls the operation of the host device by executing instructions that may be stored within the host device or external to the host device.

In some embodiments, the electronic device may include a DDR5 (Double Data Rate type 5) SDRAM (synchronous dynamic random access memory) integrated on a semiconductor chip, a LPDDR4 (Low Power Double Data Rate type 4) DRAM (dynamic random access memory) integrated on a single semiconductor chip, and the like. Each electronic device is provided with a memory device 10 coupled to an external terminal. It should be understood that these external terminals may be bonding pads, inputs, pins, and the like, but are referred to as pads or terminals for ease of discussion herein. The memory device 10 may facilitate read and/or write operations based at least in part on CA signals and/or external clock signals (CLK and CLKF) and the external clock enable (CKE) signal supplied from a processing core of the electronic device or an external host device.

The CA signals and the external clock signals may be supplied to CA pads or terminals 12 and clock (e.g., CLK, CLKF and CKE) pads or terminals 14 of the electronic device, for example, via a CA bus and a clock bus, or any suitable communicative coupling from a controller or host processor. The CA signals and the external clock signals are supplied to the memory device 10, thereby facilitating access operations with respect to memory cell arrays included in the memory device 10. In addition, the memory device 10 may receive additional signals, such as chip select (CS) signals, from a host processor/controller, and these signals may be individually supplied to one or more memory devices 10 of the electronic device. As depicted, the memory device 10 receives a chip select (CS) signal at a chip select (CS) pad or terminal 16. The chip select (CS) signal may activate the memory device 10 for memory operations. The CS signal transmits from the CS pad 16 to chip select (CS) Input Circuitry 17. The CS Input Circuitry 17 includes circuitry to enable the CA Input Circuitry 38 to permit transmission of CA signals into the memory device 10.

Memory device data (DQ) may be read from or written to the memory device 10 at data pads or terminals 18 via a communicative coupling, responsive to receipt of CA signals. In some embodiments, a memory device 10 may not permit both reading and writing actions, such as in the case of a read only memory (ROM) based electronic device.

A memory device 10 may include one or more memory cell arrays 20 (or memory banks BANK-0 to BANK-7), which each respectively may include word lines (WL), bit lines (BL) and inverse bit lines (BLB), arranged in a grid pattern. In the illustrated memory cell arrays 20, each memory cell includes an access device 22, such as a transistor, and a storage device 24, such as a capacitor. As will be appreciated, many other types of memory cell arrays may be utilized. A Row Decoder/Driver 26 may select word lines, while a Column Decoder/Driver 28 may select bit lines and inverse bit lines. The bit lines (BL) and inverse bit lines (BLB) may be paired and coupled to a Sense Amplifier 30 (SA) of a Memory Cell Array 20. The Sense Amplifier 30 may amplify a voltage difference generated between the bit lines BL and BLB. The Sense Amplifier 30 may also supply read data based at least in part on the voltage difference generated between the bit lines BL and BLB to complementary local input/output lines (LIOT/B), where the local input/output line may represent a pair of lines (e.g., normal and inverted lines). The read data supplied to the local input/output lines may be transferred to complementary main input/output lines (MIOT/B) via a switch circuit (TG) 32. The read data on the main input/output lines may be converted to single ended signals and transmitted to a data (DQ) input/output circuit 34 via a read/write amplifier 36 (RW AMP) that acts to translate electrical signal values (e.g., voltage levels) between values interpretable at the pads and values interpretable by the internal Memory Cell Array 20.

As described previously, the memory device 10 may include the CA pads 12, the clock (e.g., CLK, CLKF and CKE) pads 14, the data (DQ) pads 18, and one or more chip select (CS) pads 16, to receive external command, address, clock, select and data signals. As will be appreciated, the memory device 10 may also include one or more voltage pads to receive various voltages (e.g., VDD corresponding to logical high voltage values and VSS corresponding to logical low voltage values), for instance. A number of other voltage signals may also be provided to different input pads for powering/controlling various other portions of the memory device 10, as will be appreciated. The voltages may be provided to power circuitry of the memory device (not shown), which may generate various internal voltage potentials based at least in part on the power-source potentials (e.g., VDD). The internal potentials may be transmitted to the Row Decoder 26, the Sense Amplifiers 30, and the like to facilitate operation of the memory device 10. Furthermore, the voltages may be provided to a power-on detector to determine if electrical signals (e.g., current) are flowing to the voltage pads of the memory device. In response to this determination, a memory device 10 may change operation, for example, may act to reset its own circuitry to prepare for a next memory operation.

The CA signals are received at the CA pads 12 and may be transmitted to CA Input Circuitry 38. The memory device 10 may include any suitable number of CA pads 12, and as depicted, the memory device 10 includes (m+1)-number of CA pads 12 (i.e., CA0-CAm). As previously described, the CA signals may include address signals and command signals. The address signals may be transmitted to an Address Decoder 40 and the command signals may transmit to a Command Decoder 42. The Address Decoder 40 may supply row addresses to the Row Decoder/Driver 26 and column addresses to the Column Decoder/Driver 28. The Command Decoder 42 may generate internal commands by decoding the command signals, and may transmit the internal commands to various circuits in the memory device 10. For example, the Command Decoder 42 may generate active signals, read signals, write signals, and the like to transmit to various circuits in the memory device.

In response to the output from the Command Decoder 42, a Clock Input Circuitry and Internal Clock Generator, herein referred to as Clock Generator 44, may enable and/or disable a variety of control signals to operate memory device 10 circuitry, for example, mode registers, delay circuitry, reset control circuitry, the Column Decoder/Driver 28, and the Row Decoder/Driver 26, to perform operations according to the internal commands, such as resetting operations, reading operations, and/or writing operations. For example, in response to an activate command, the Command Decoder 42 and the Clock Generator 44 may operate to enable a word line responsive to a row address transmitted to the memory device 10. The CA Input Circuitry 38, the Address Decoder 40, the Command Decoder 42, the Column Decoder/Driver 28, and the Row Decoder/Driver 26 may constitute a CA control circuit and may access the Memory Cell Array 20.

Further, the Command Decoder 42 may provide various internal commands to various other portions of the memory device 10. With specific regard to read operations, the Command Decoder 42 may output a decoded read command (RDC) signal, and various read clock enable signals, such as RClk_EN1 and RClk_EN 2 to facilitate read operations, as will be described further below.

The external clock signals may be transmitted to the memory device 10 at clock pads 14. The external clock signal CLK and the external clock signal CLKF may be mutually complementary signals (e.g., CLKF is inverse of CLK), and may both be supplied to the Clock Generator 44. The Clock Generator 44 may generate one or more internal clock signals, such as a latch clocking signal (not shown) used as a timing signal that defines operation of one or more latching circuits of the memory device 10. The Clock Generator 44 may also generate various other internal clocking signals, such as a phase-controller internal clock signal. In some embodiments, the Clock Generator 44 may include clock distribution circuitry and/or delay locked loop (DLL) circuitry, where data associated with the Data Input/Output (I/O) Circuit 34 is used to determine output timing of the read data (DQ). As depicted, the clock used to time read/write data (DQ) at the DQ I/O circuit 34 is a data strobe (DQS) signal, which may be accessed at data strobe (DQS) pad or terminal 48. As described in greater detail with regard to FIG. 1, the Clock Generator 44 may also generate internal clock signals (INTCLK) which may be used to synchronize various operations, such as read and write operations, within the memory device 10.

The memory device also includes a data strobe (DQS) Circuit 50 having DQS signal generators, therein. With particular regard to the read commands, the DQS Circuit 50 includes a Read DQS Generator 52. As will be described and illustrated with regard to FIG. 2 below, the Read DQS Generator 52 receives the decoded internal read command (RDC) signal and the RClk_EN2 signal from the Command Decoder 42. Further, the Read DQS Generator 52 also receives an internal read clock signal (READ_CLK) from the Clock Generator 44. The functionality of these signals and associated circuits will be described in detail below.

Figure 2:
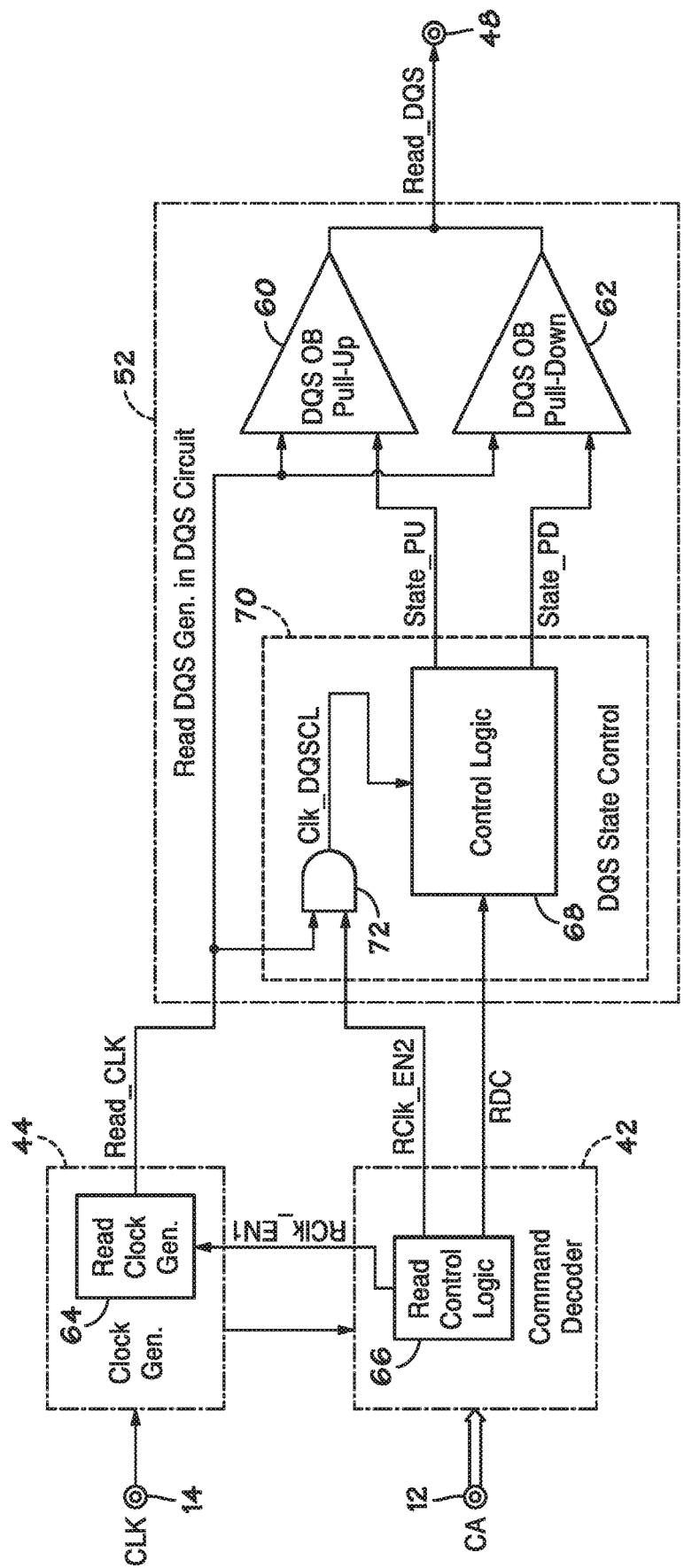
FIG. 2 is a block diagram of a portion of the memory device of FIG. 1, including a Read Data Strobe (DQS) Generator, in accordance with an embodiment of the present disclosure.

Referring now to FIG. 2, a schematic block diagram of a portion of the memory device 10 of FIG. 1, including an embodiment of the Read DQS Generator 52 of the DQS Circuit 50, as well as portions of the Command Decoder 42 and Clock Generator 44 related to the read portions of the DQS Circuit 50, are illustrated. In the illustrated embodiment, the Read DQS Generator 52 includes a DQS OB (output buffer) Pull-Up Driver 60 and a DQS OB (output buffer) Pull-Down Driver 62. The DQS OB Pull-Up Driver 60 is controlled by a State_PU signal. An active level of the State_PU signal enables the DQS OB Pull-Up Driver 60 so that the DQS OB Pull-Up Driver 60 drives the DQS terminal 48 to high level in response to a high level of an internal read clock (Read_Clk) signal and stops driving the DQS terminal 48 in response to a low level of the Read_Clk signal. Conversely, an inactive level of the State_PU signal turns off the DQS OB Pull-Up Driver 60. In a similar matter, an active level of a State_PD signal enables the DQS OB Pull-Down Driver 62 so that the DQS OB Pull-Down Driver 62 drives the DQS terminal 48 to a low level in response to a low level of the internal Read_Clk signal and stops driving the DQS terminal 48 in response to a high level of the internal Read_Clk signal. An inactive level of the State_PD signal turns off the DQS OB Pull-Down Driver 62.

As illustrated, the DQS terminal 48 is brought into a high impedance (Hi-Z) state when both the State_PU signal and the State_PD signal are inactive (i.e., each of the DQS OB Pull-Up Driver 60 and the DQS OB Pull-Down Driver 62 are turned off). The Hi-Z state refers to a floating or tri-state wherein the signal is not driven to a defined logic level. On the other hand, the DQS terminal 48 is toggled by the DQS OB Pull-Up Driver 60 and the DQS OB Pull-Down Driver 62 to provide a Read_DQS signal at the DQS terminal 48 when both State_PU and State_PD are at an active level. Further, the combinations in the level of the State_PU signal and the State_PD signal provide the read pre-amble and read post-amble conditions between which a data read out period is generally defined. The read pre-amble and post-amble conditions are controllable by changing the combinations in level of the State_PU signal and the State_PD signal. During the data read out period, a DQ output buffer in DQ I/O circuit 34 (FIG. 1) drives the DQ terminals 18 in response to each of the edges of the Read_DQS signal at the DQS terminal 48 to provide (i.e., read out) data to an external device such as a memory controller at double data rate, for a DDR memory device 10, for instance.

The internal read clock signal Read_CLK is provided by a Read Clock Generator 64 (Read Clock Gen.) in the Clock Generator 44 (Clock Gen.) and is generated from the external CLK signal. The Read Clock Generator 64 is activated responsive to an active level of a (first) read clock enable (RClk_EN1) signal. The RClk_EN1 signal is provided to the Read Clock Generator 64 by a Read Control Logic 66 that handles read commands in the Command Decoder 42. That is, when a read command is supplied to (e.g., at the CA terminal) and decoded by the Command Decoder 42, the Read Control Logic 66 changes the RClk_EN1 signal from an inactive level to an active level so that Read Clock Generator 64 starts providing the internal Re ad_CLK signal to the Read_DQS Generator 52. The Read Control Logic 66 further changes the decoded read command signal (RDC) to an active level to activate Control Logic 68 in a DQS State Control Circuit 70 of the Read_DQS Generator 52. By changing the RDC signal to an active level, the Control Logic 68 is configured to control the respective levels of the State_PU and State_PD signals in response the output (Clk_DQSCL) of a gate circuit, such as an AND gate 72, for example.

The AND gate 72 receives the internal Read_CLK signal from the Read Clock Generator 64 and a second read clock enable signal (RClk_EN2) from the Read Control Logic 66. The "open" or "closed" state of the gate circuit, here the AND gate 72, is thus controlled by RClk_EN2 which passes or prevents the passing of the internal Read_CLK signal from the Read Clock Generator 64, through the gate circuit 72. That is, the AND gate 72 is configured to selectively allow or prevent the Read_CLK signal from being received by the Control Logic 68 (as CLK_DQSCL), based on the state or logic levels of the RClk_EN2 signals, to ultimately enable or disable the drivers (DQS OB Pull-Up 60 and DQS OB Pull-Down 62) from driving the DQS terminal 48, via the Read_DQS signal. The logic levels of the RClk_EN2 signal are controlled by the Read Control Logic 66 in response to the particular data read mode, such as a "non-burst" read operation mode and a "burst" read operation mode, described above and as discussed in detail below with reference to the timing diagrams of FIGS. 3-5.

Figure 3:
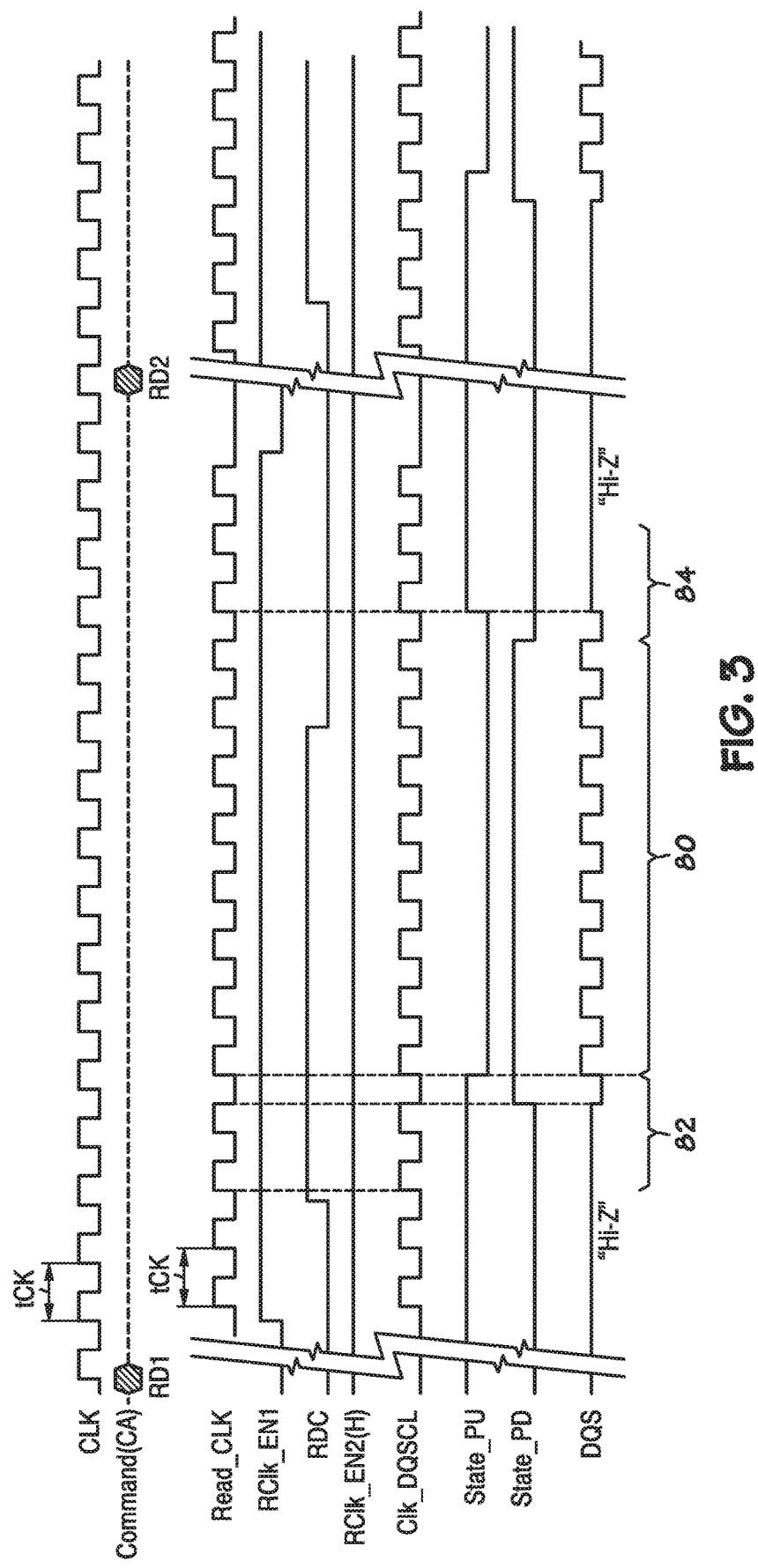
FIG. 3 is a timing diagram of signals used in operation of the Read DQS Generator of FIG. 2, during non-burst read operations, in accordance with an embodiment of the present disclosure.

Turning now to FIG. 3, a timing diagram indicative of non-burst read operations is illustrated. As previously described, and as used herein, a "non-burst read operation" is performed when successive read commands are received at a time interval greater than the time it takes to capture the data equivalent to one burst length (BL). In the illustrated example of a DDR memory, the burst length is equal to 16, and thus, 16-bits of data will be read out consecutively, responsive to a single read command (e.g., RD1 and RD2). For double data rate (DDR) SDRAM devices, 16-bits will be read out in 8 clock cycles (8-tCK). As will be appreciated, because the internal Read_CLK signal is generated from the external CLK signal, each clock cycle will have a clock period equal to 1-tCK. As is clear from FIG. 3, the two successive read commands RD1 and RD2 are issued or asserted at a time interval greater than 8-tCK and are thus non-burst read operations. While the example provided with regard to FIG. 3 refers to a DDR memory device operating at read burst lengths of 16, those skilled in the art will appreciate that other types of memory and burst lengths will provide for different timings of non-burst and burst read operations.

As previously described, in the non-burst read operations, the respective levels of the signals RClk_EN1, RDC and RClk_EN2 are controlled such that the Control Logic 68 of DQS State Control Circuit 70 continues to receive the internal Read_CLK over the entire period of each data read operation (e.g., RD1 and RD2). In other words, the Control Logic 68 of the DQS State Control Circuit 70 continues to receive the Read_CLK (via the AND gate 72) during the data read out period, such as the data read out period 80 responsive to RD1. As will be understood, the length of the data read out period 80 is determined by the type of memory device 10 and the burst length (BL), related to a single read command (e.g., RD1 or RD2). In the illustrated embodiment employing a DDR memory device 10 and a BL=16, the data read out period 80 is equal to 8-tCK.

Further, the read pre-amble and post-amble conditions are controllable by changing the combinations in level of the State_PU signal and the State_PD signal, such as the read pre-amble 82 and read post-amble 84, associated with RD1. Thus, the transition of the State_PU signal from high to low, in combination with the transition of the State_PD signal from low to high, will trigger the end of the pre-amble 82 and the start of the data read out period 80. Similarly, the transition of the State_PU signal from low to high, in combination with the transition of the State_PD signal from high to low at the end of the data read out period 80 will trigger the post-amble 84. As is illustrated in FIG. 3, the periods of pre-amble 82 and post-amble 84 as well as the controls in level of the State_PU and State_PD signals during such periods are performed in response to (or in synchronism with) the Read_CLK signal. In other words, the Control Logic 68 of the DQS State Control circuit 70 uses the Read CLK signal to control the DQS signal for the pre-amble 82 and post-amble 84. On the other hand, each of the State_PU and State_PD signals is maintained at the active level during the data read out period 80.

Figure 4:
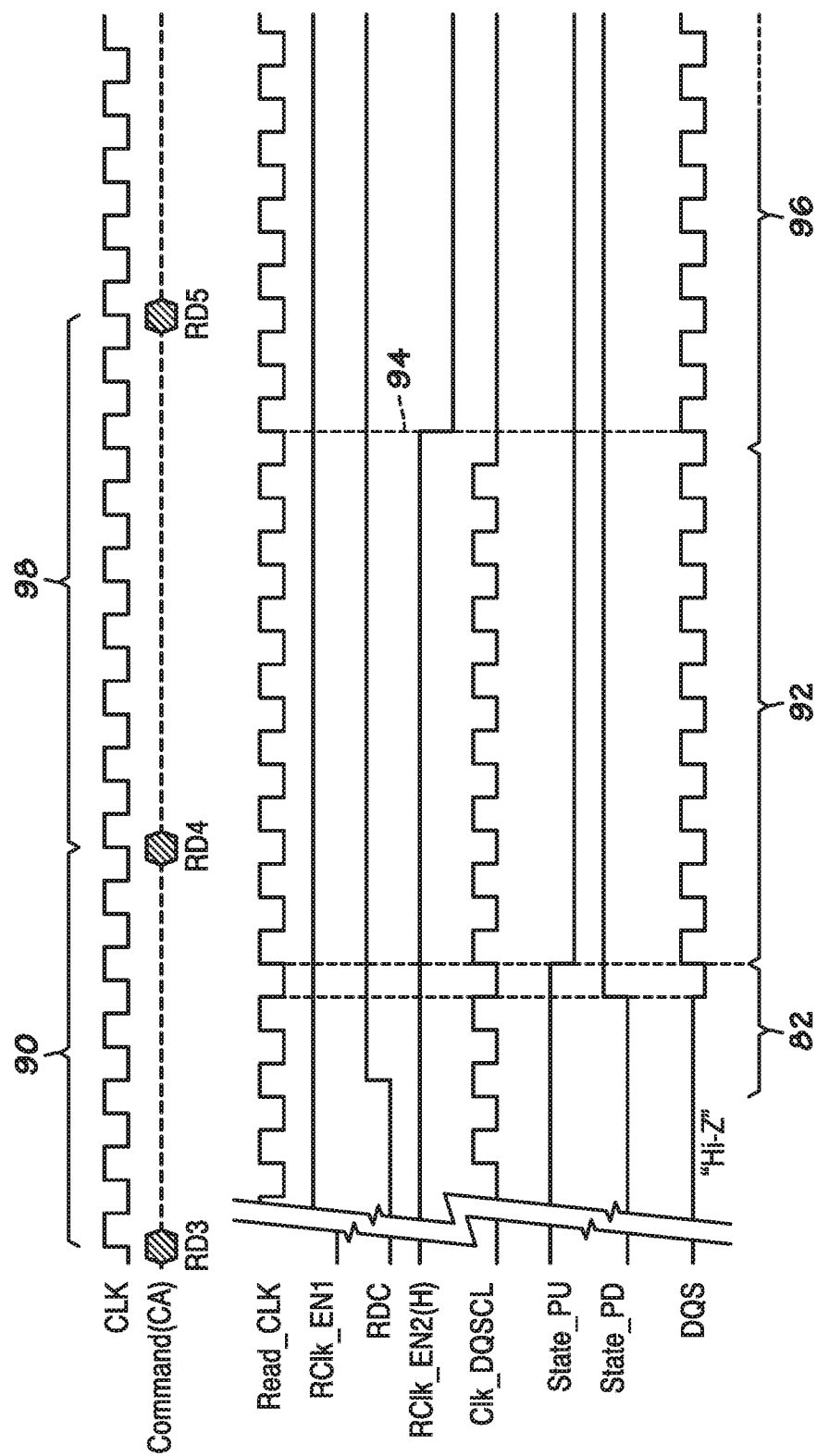
FIGS. 4 and 5, in conjunction, are timing diagrams of signals used in operation of the Read DQS Generator of FIG. 2, during burst read operations, in accordance with an embodiment of the present disclosure.
Figure 5:
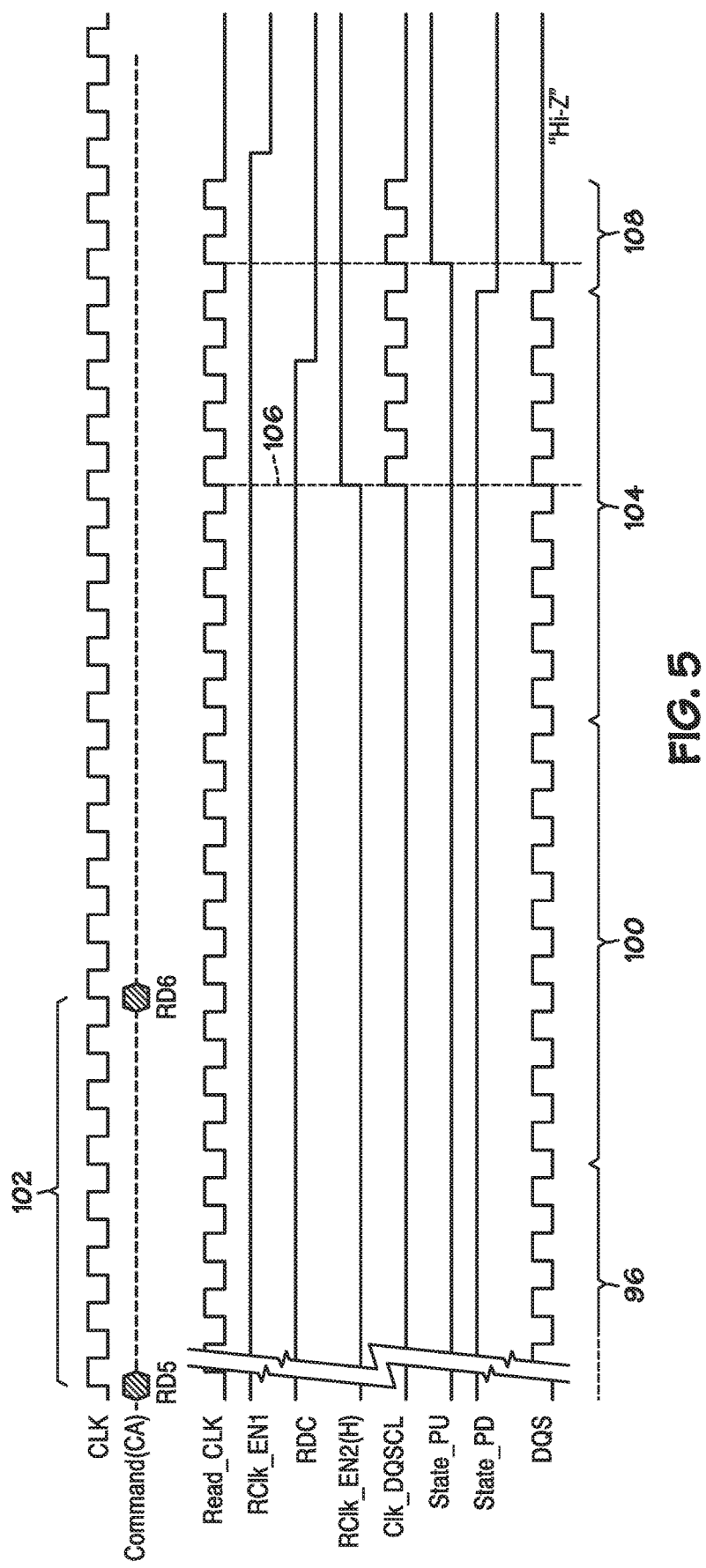

Turning now to FIGS. 4 and 5, which should be viewed in conjunction, a timing diagram indicative of burst read operations is illustrated. As previously described, and as used herein, a burst read operation is performed when successive read commands are received at a time interval equal to the time it takes to capture the data equivalent to one burst length (BL) (i.e., the data read out period). In the illustrated example of a DDR memory device 10 operating at read burst lengths equal to 16, the burst read operation will occur when two or more read commands are issued or asserted consecutively at a time interval equal to 8-tCK. In FIGS. 4 and 5, following a read command RD3, three consecutive read commands RD4, RD5 and RD6 are issued with such a relationship, and are thus burst read operations.

Referring initially to FIG. 4 and referring back to FIG. 2, as the Read Control Logic 66 determines that the read command RD4 following the read command RD3 has been issued at a time indicative of a burst read mode (i.e., RD4 is received at a time period 90, that is equal to a data read out period, here 8-tCK), the Read Control Logic 66 transitions the RClk_EN2 signal from the active level (H level) to an inactive level (L level) at the end of the data read out period 92 based on the read command RD3, as indicated at time 94. In response to the transition of the RClk_EN2 signal, the gate circuit (e.g., AND gate 72) is thus "closed" to prevent the internal Read_CLK from being transferred to the Control Logic 68 of the DQS State Control Circuit 70. However, as illustrated, and in contrast with the non-burst mode of operation illustrated in FIG. 3, the Read Control Logic 66 keeps the RDC signal at an active level because the device is operating in the burst read mode. Accordingly, the Control Logic 68 of the DQS State Control Circuit 70 maintains the State_PU and State_PD signals at respective active levels (L and H) so that the read_DQS signal is continued in order to provide the data read out based on the read command RD4. That is, the data read out period 96, responsive to the read command RD4, begins immediately after the data read out period 92, because RD4 is a burst read operation.

Referring to FIGS. 4 and 5, the same situation occurs with respect to the data read out based on the read commands RD5 and RD6. That is, because the time period 98 between the read commands RD4 and RD5 is equal to the associated data read out period (here, 8-tCK), the burst read mode of operation will continue as described above with regard to the signals associated with the read command RD4 following the read command RD3. Thus, the data read out during the data read out period 100, responsive to the read command RD5, begins immediately after the data read out period 96, because RD5 is a burst read operation. Similarly, the time period 102 between the read commands RD5 and RD6 is equal to the associated data read out period (here, 8-tCK), and thus, the burst read mode of operation will continue, and the data read out during the data read out period 104, responsive to the read command RD6, begins immediately after the data read out period 100, because RD6 is a burst read operation.

As shown in FIG. 5, another read command is not issued within the data read out period, here 8-tCK, after the read command RD6 and thus, the burst read operations will terminate with the data read out during the data read out period 104 based on the read commend RD6. The termination of the burst read operations may be informed by issuance of any other commands such as a write command or another read command. Accordingly, Read Control Logic 66 transitions the RClk_EN2 signal to a high (H) level after about half of the data (about 8 bits) have been provided at the DQ terminals 48 during the data read out period 104 based on the read command RD6, as indicated at time 106. In response, the gate circuit 72 is thus "opened" to resume transfer of the Read_CLK signal to the Control Logic 68 of the DQS State Control Circuit 70, so that Control Logic 68 is ready to perform a read post-amble operation 108. Subsequently, the Read Control Logic 66 transitions the RDC signal to the inactive level (L) to prompt the Control Logic 68 of the DQS State Control Circuit 70 to provide the read post-amble signals 108 after completion of the data read out during the data read out period 104, based on the read command RD6. Finally, the Read Control Logic 66 transitions the RClk_EN1 to the inactive level (L) to deactivate Read Clock Generator 64 so that the internal Read_CLK signal (and Clk_DQSCL) are stopped from being provided by the Read Clock Generator 64.

Accordingly, when one or more successive read commands are received within the length of the data read out period, such as 8-tCK in the example above, a gate circuit, such as the AND gate 72, will be closed. For instance, referring again to FIGS. 4 and 5, the AND gate 72 will be closed, thereby preventing the Control Logic 68 of the DQS State Control Circuit 70 from receiving the Read_CLK signal, as indicated by the inactive state of the Clk_DQSCL signal beginning at time 94. While the Control logic 68 does not receive the Read_CLK signal, it maintains each of the State_PU and State_PD signals at the active level. Accordingly, the drivers (i.e., DQS OB Pull-Up 60 and DQS OB Pull-Down 62) continue to operate to toggle the read_DQS signal, resulting in that the data DQ will be successively readout during successive data read out periods (e.g., 96, 100 and 104), without performing pre-amble and post-amble operations for the associated read commands, until other operations than a burst read operation is detected. By eliminating internal toggling and control by the DQS state control 70 during read burst periods, current and power savings may be achieved.

Figure 6:
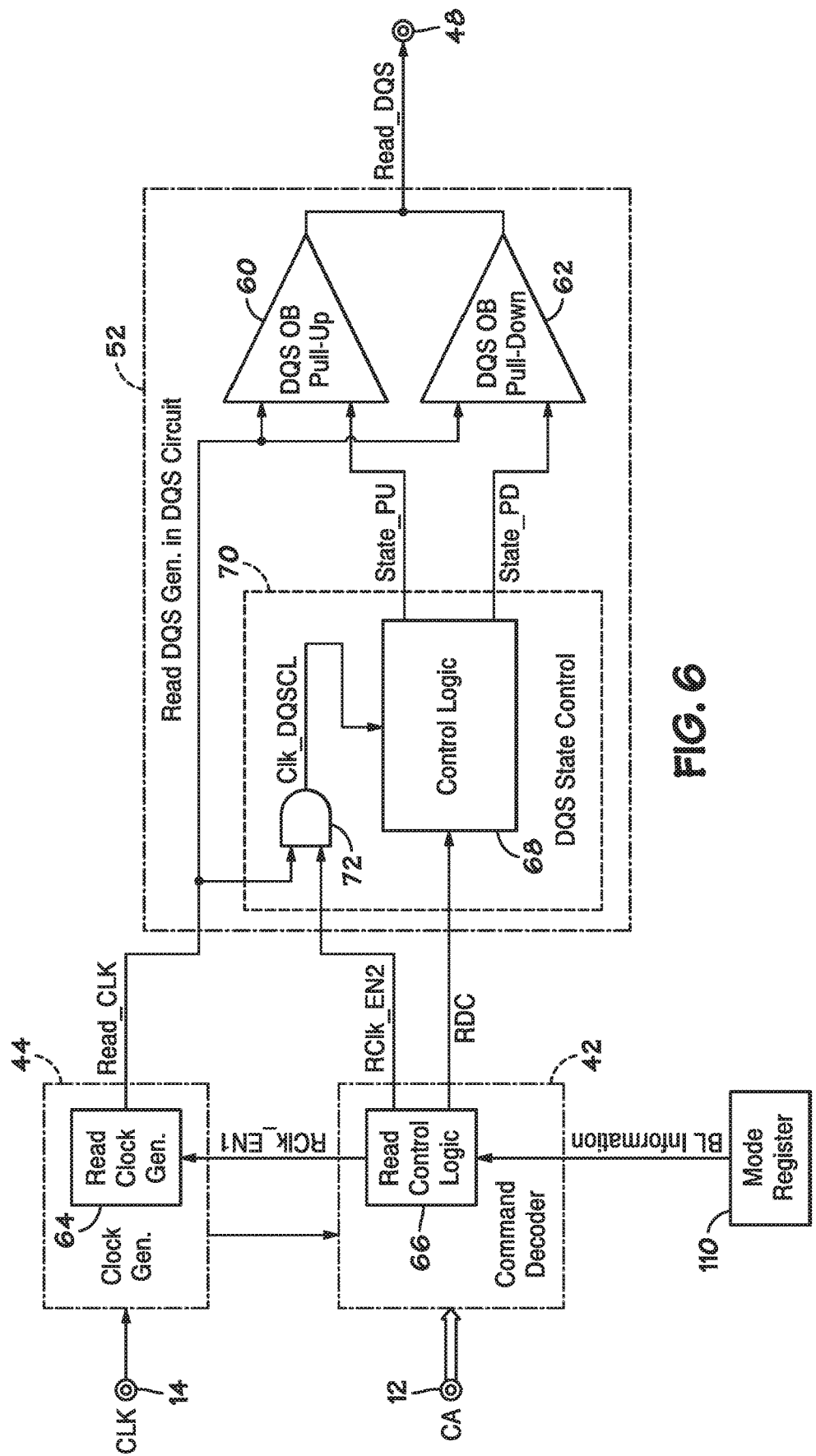
FIG. 6 is a block diagram of a portion of the memory device of FIG. 1, including a Read DQS Generator, in accordance with another embodiment of the present disclosure.
Figure 7:
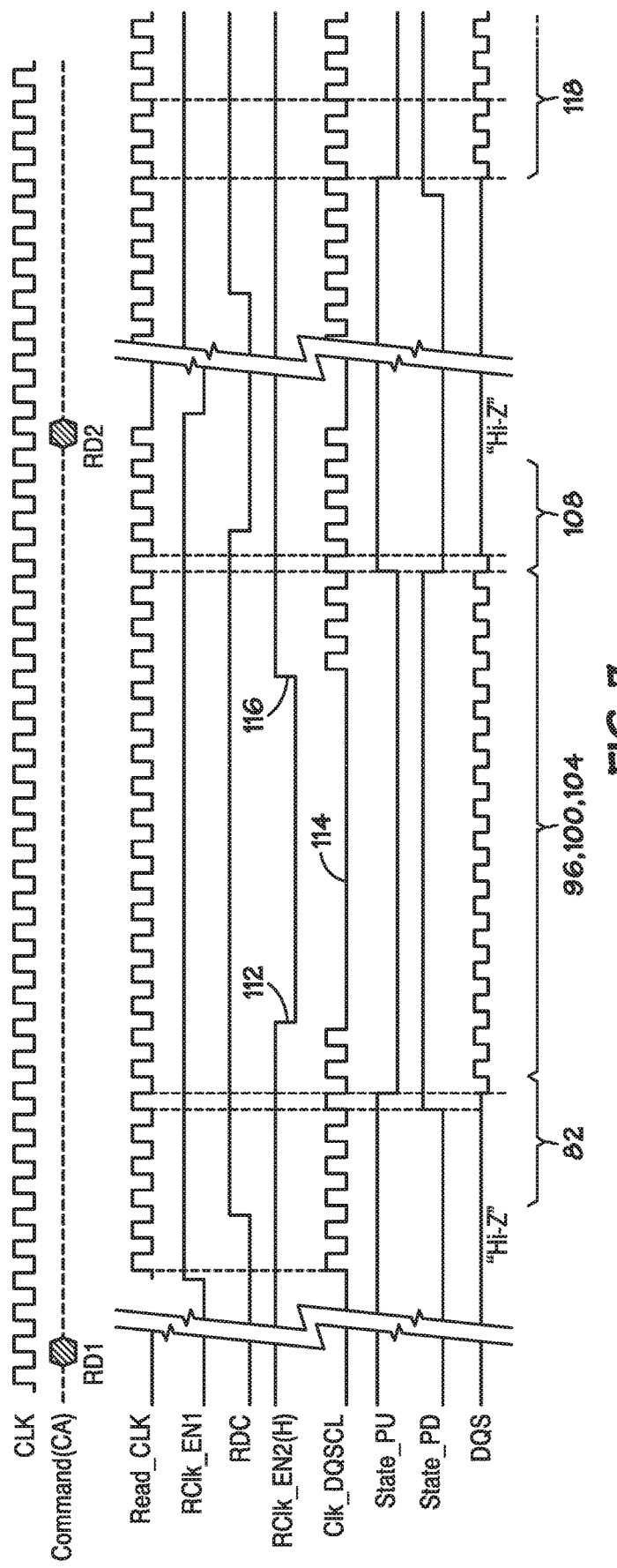
FIG. 7 is a timing diagram of signals used in operation of the Read DQS Generator of FIG. 6, during non-burst read operations, in accordance with an embodiment of the present disclosure.

Referring now to FIGS. 6 and 7, another embodiment of the relevant portions of the memory device 10 and the associated timing diagram are illustrated. Specifically, FIG. 6 illustrates another schematic block diagram of a Read DQS Generator 52 in the DQS Circuit 50, as well as respective parts of Command Decoder 42 and Clock Generator 44 related to the read portions of the DQS Circuit 50. The embodiment of FIG. 6 is different from the embodiment of FIG. 2 in that Read Control Logic 66 receives variable burst length (BL) information from a Mode Register 110 of the memory device 10. In one embodiment, the burst length (BL) is configurable to one of two states. For instance, the burst length (BL) information from the Mode Register 110 may be at high (H) level in the case of BL=16 and may be at low (L) level in case of BL=32, for instance. As will be appreciated, in alternative embodiments, more than two states corresponding to more than two configurable burst lengths may be provided by the mode register 110. For instance, a plurality of bits may be provided by the mode register 110 as BL information to indicate one of BL=8, BL=16 and BL=32 (or more). The number of selectable burst lengths and the specific burst lengths may vary depending on the design of the memory device 10.

In the illustrated embodiment, when the BL information sent to the Read Control Logic 66 is at a high (H) level, indicating BL=16, this embodiment of FIG. 6 performs the same operations as previously described with regard to FIG. 3. In other words, the embodiment of FIG. 6 may support both non-burst read operations and burst read operations. Further, in accordance with the embodiment illustrated in FIG. 6, when the BL information sent to the Read Control Logic 66 is at a low (L) level indicative of BL=32, the non-burst operations as shown in FIG. 7 are performed. As will be apparent in FIG. 7 (BL=32), since 32 bits of data are output consecutively from each DQ terminal 18 (FIG. 1) in synchronism with read DQS signal at DQS terminal 48, the RClk_EN2 is transitioned in level (e.g., high to low) after pre-amble process as shown in FIG. 7 to stop supplying the Read_CLK signal from the Read Clock Generator 64 to the Control Logic 68 of the DQS State Control Circuit 70 (i.e., by closing the AND gate 72) to further reduce power consumption. That is, in response to the transition 112 of the RClk_EN2 signal, the Clk_DQSCL signal will remain inactive for a period of time 114 during which time the Control Logic 68 does not need the Read_CLK signal. The period of time 114 ends when the RClk_EN2 is transitioned to high again (time 116) and the Control Logic 68 again receives the Read_CLK signal for post-amble process. As also indicated, a second data read out period 118 is illustrated following the receipt of a second read command RD2 and pre-amble processing. It should be noted that the burst read operations upon BL=32 may be performed in the same manners as discussed with reference to FIGS. 4 and 5. It should also be noted that partial stop of the transfer of the Read_CLK to Control Logic 68 during the data read out period may also be applied to the case of BL=16, in order to reduce power consumption, as well.

As will be appreciated, during burst read operations, the embodiment of FIG. 6 will operate in the same manner as previously described in FIGS. 4 and 5, as related to the embodiment of FIG. 2. However, when the burst length (BL) is 32, the data read out period will be equal to 16-tCK (rather than 8-tCK, when BL=16). Thus, successive read commands will trigger a burst read mode of operation when a read command follows the immediately prior read command by 16-tCK or less. Thus, while the operation of the Read DQS Generator 52 will remain the same, the amount of time between read commands that will trigger the burst mode of operation, and thus the suppression of the Read_CLK signal to the Control Logic 68 will vary depending on the burst length.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An apparatus comprising:
    output buffer circuitry configured to selectively pass a read clock signal to an output terminal; and
    control logic configured to selectively receive the read clock signal, and to:
        place, during a first period, the output buffer circuitry into an active state;
        hold, during a second period, the output buffer circuitry in the active state; and
        place, during a third period, the output buffer circuitry into an inactive state;
    wherein the output buffer circuitry, while in the active state, is configured to allow the read clock signal to pass to the output terminal;
    wherein the control logic is configured to place the output buffer circuitry into the active state or inactive state in response to at least the read clock signal; and
    wherein the control logic is prevented from receiving the read clock signal during at least a portion of the second period.

2. The apparatus of claim 1, wherein the second period is during a burst read mode operation.

3. The apparatus of claim 2,
    wherein the burst read mode operation is initiated responsive to at least first and second read commands issued consecutively, wherein the first read command is followed by the second read command;
    wherein the control logic receives the read clock signal while the output buffer passes the DQS signal to the output terminal based on the first read command; and
    wherein the control logic does not receive the read clock signal while the output buffer passes the read clock signal to the output terminal based on the second read command.

4. The apparatus of claim 1, further comprising:
    a decoded read command (RDC) signal received by the control logic, wherein:
    if the RDC signal transitions from a first value to a second value, the control logic places the output buffer circuitry into the active state during the first period;
    if the RDC signal holds the second value, the control logic holds the output buffer circuitry in the active state during the second period; and
    if the RDC signal transitions from the second value to the first value, the control logic places the output buffer circuitry into the inactive state during the third period.

5. The apparatus of claim 4, further comprising:
    read control logic; and
    a mode register;
    wherein the read control logic receives variable burst length (BL) information from the mode register, and wherein the RDC signal is responsive to the variable BL information.

6. The apparatus of claim 5,
    wherein the apparatus is configured to receive an enable signal from the read control logic, responsive to the variable BL information; and wherein the control logic is configured to receive the read clock signal responsive to the enable signal.

7. The apparatus of claim 6, further comprising:
a gate circuit;
   wherein the gate circuit receives the enable signal and the read clock signal; and
wherein the gate circuit passes the read clock signal to the control logic responsive to the enable signal.

8. The apparatus of claim 1,
wherein the apparatus is configured to receive an enable signal; and
wherein the control logic is configured to receive the read clock signal responsive to the enable signal.

9. The apparatus of claim 1, comprising:
a gate circuit;
wherein the gate circuit selectively provides a control logic clock signal (Clk_DQSCL) to the control logic.

10. The apparatus of claim 1, wherein the output buffer circuitry comprises a data strobe (DQS) output buffer pull-up driver and a DQS output buffer pull-down driver.

11. An apparatus comprising:
output buffer circuitry configured to provide a data strobe (DQS) signal to an output terminal responsive to a read clock signal; and
control logic configured to selectively receive the read clock signal, and to:
   place, during a first period, the output buffer circuitry into an active state;
   hold, during a second period, the output buffer circuitry in the active state; and
   place, during a third period, the output buffer circuitry into an inactive state;
wherein the output buffer circuitry, while in the active state, is configured to provide the DQS signal to the output terminal;
wherein the control logic is configured to place the output buffer circuitry into the active state or inactive state in response to at least the read clock signal; and
wherein the control logic is prevented from receiving the read clock signal during at least a portion of the second period.

12. A method, comprising:
receiving, at output buffer circuitry, a read clock signal from a read clock generator;
   placing the output buffer circuitry in an active state during a first period in response to an activate signal from control logic, wherein the activate signal is responsive to the read clock signal;
holding the output buffer circuitry in the active state during a second period;
   placing the output buffer circuitry in an inactive state during a third period in response to a deactivate signal from the control logic, wherein the deactivate signal is responsive to the read clock signal;
   passing a data strobe (DQS) signal, responsive to the read clock signal, from the output buffer circuitry to an output terminal while the output buffer circuitry is in the active state; and
   preventing the control logic from receiving the read clock signal during at least a portion of the second period.

13. The method of claim 12, further comprising:
receiving, at a gate circuit, the read clock signal; and
selectively providing, from the gate circuit, the read clock signal to the control logic.

14. The method of claim 13, further comprising:
receiving, at the gate circuit, an enable signal; and
providing, from the gate circuit, the read clock signal to the control logic responsive to the enable signal.

15. The method of claim 14, wherein the state of the enable signal is at least partially dependent on a burst length (BL).

16. The method of claim 12, further comprising:
receiving, at the control logic, a decoded read command (RDC) signal, wherein
   if the RDC signal transitions from a first value to a second value, the control logic places the output buffer circuitry into the active state during the first period;
   if the RDC signal holds the second value, the control logic holds the output buffer circuitry in the active state during the second period; and
   if the RDC signal transitions from the second value to the first value, the control logic places the output buffer circuitry into the inactive state during the third period.

17. The method of claim 16, wherein a burst length (BL) is associated with the RDC signal.

18. An apparatus comprising:
a clock generator; and
a data strobe (DQS) generator, wherein the DQS generator further comprises:
   a DQS state control; and
   an output buffer;
wherein the clock generator provides a read clock signal to the DQS generator, and wherein the DQS state control circuit selectively receives the read clock signal;
   wherein the DQS state control circuit selectively provides an activate signal to the output buffer responsive to at least the read clock signal, and
   wherein the output buffer selectively provides a DQS signal to an output terminal responsive to at least the read clock signal and the activate signal.

19. The apparatus of claim 18, further comprising:
a command decoder, configured to selectively provide a decoded read command (RDC) signal to the DQS state control circuit, wherein the DQS state control circuit provides an activate signal to the output buffer responsive to the RDC signal.

20. The apparatus of claim 19, wherein the DQS state control circuit does not receive the read clock signal during at least a portion of the time when the RDC signal is enabled.

21. The apparatus of claim 20, wherein the command decoder is configured to selectively provide an enable signal to the DQS state control circuit, wherein the DQS state control circuit receives the read clock signal responsive to at least the enable signal.

* * * * *